(12) United States Patent
Aguiar Dantas de Britto et al.

(10) Patent No.: US 11,942,995 B2
(45) Date of Patent: Mar. 26, 2024

(54) UP/DOWN PHOTONIC FREQUENCY CONVERTER FOR INCOMING RADIO FREQUENCY (RF) SIGNALS BUILT INTO THE OPTOELECTRONIC OSCILLATOR (OEO)

(71) Applicant: INSTITUTO TECNOLÓGICO DE AERONÁUTICA—ITA, São José dos Campos (BR)

(72) Inventors: Larissa Aguiar Dantas de Britto, São José dos Campos (BR); Jognes Panasiewicz Junior, São José dos Campos (BR); Gefeson Mendes Pacheco, São José dos Campos (BR)

(73) Assignee: Instituto Tecnológico de Aeronáutica—ITA, São dos Campos (BR)

( * ) Notice: Subject to any disclaimer, the term of this patent is extended or adjusted under 35 U.S.C. 154(b) by 257 days.

(21) Appl. No.: 17/603,728

(22) PCT Filed: Apr. 24, 2019

(86) PCT No.: PCT/BR2019/050147
§ 371 (c)(1),
(2) Date: Oct. 14, 2021

(87) PCT Pub. No.: WO2020/215132
PCT Pub. Date: Oct. 29, 2020

(65) Prior Publication Data
US 2022/0247491 A1    Aug. 4, 2022

(51) Int. Cl.
*H04B 10/2575* (2013.01)
(52) U.S. Cl.
CPC ... *H04B 10/2575* (2013.01); *H04B 10/25759* (2013.01)

(58) Field of Classification Search
CPC ..... G02F 2/002; H04B 10/90; H04B 10/2575; H04B 2210/006; H04B 10/25759
(Continued)

(56) References Cited

U.S. PATENT DOCUMENTS 6,240,274 B1 * 5/2001 Izadpanah ........... H04L 27/2601
455/39
7,425,696 B2 * 9/2008 Kawanishi ............ G02F 1/2255
398/76
(Continued)

FOREIGN PATENT DOCUMENTS

CA     03002597 A1   5/2017
CN     108155949 A   6/2018
(Continued)

OTHER PUBLICATIONS

Zhang, T. et al., "High-Spectral-Efficiency Photonic Frequency Down-Conversion Using Optical Frequency Comb and SSB Modulation", IEEE Photonics J. 5(2) (2013).
(Continued)

*Primary Examiner* — Abbas H Alagheband
(74) *Attorney, Agent, or Firm* — Laurence P. Colton; Smith Tempel Blaha LLC

(57) ABSTRACT

A compact photonic converter for radio frequency (RF) signals comprising fewer components than in the prior art. The fields of the invention are electronics, oscillating circuits, radio frequency circuits and optoelectronics. The converter comprises an optoelectronic oscillator (OEO), which is the local oscillator (LO) for the frequency conversion operation, and an RF signal injection circuit. The OEO uses a single Mach-Zehnder (MZ) electro-optic modulator and a single photodetector to enable simultaneous up/down frequency conversion of the radio frequency signal from the
(Continued)

input of the converter. The frequency conversion is based on the intermodulation that occurs inside the MZ modulator.

4 Claims, 1 Drawing Sheet

(58) Field of Classification Search
USPC .................................................. 398/115
See application file for complete search history.

(56) References Cited

U.S. PATENT DOCUMENTS

| 7,933,524 | B2* | 4/2011 | Park | H04B 10/50 |
| | | | | 398/201 |
| 9,680,576 | B1* | 6/2017 | Middleton | H04B 10/548 |
| 10,063,320 | B2 | 8/2018 | Clark, Jr. | |
| 10,659,162 | B2* | 5/2020 | Han | H04B 10/2575 |
| 10,784,967 | B2* | 9/2020 | Jin | H04B 10/503 |
| 2001/0014106 | A1* | 8/2001 | Gevorgian | H03B 28/00 |
| | | | | 372/20 |
| 2014/0270786 | A1* | 9/2014 | Poddar | H04B 10/50 |
| | | | | 398/116 |
| 2016/0254646 | A1 | 9/2016 | Li et al. | |
| 2018/0248518 | A1* | 8/2018 | Nicholls | H03H 9/6406 |
| 2020/0112370 | A1* | 4/2020 | Han | H04B 10/5057 |
| 2022/0021454 | A1* | 1/2022 | Maleki | H04B 10/00 |

FOREIGN PATENT DOCUMENTS

| CN | 109194410 A * | 1/2019 | ......... H04B 10/5561 |
| CN | 109194410 A | 1/2019 | |
| CN | 108270141 B * | 5/2020 | ............... H01S 1/02 |
| TW | 201201503 A | 1/2012 | |
| WO | WO-2013075566 A1 * | 5/2013 | ............. G02F 1/353 |
| WO | 2013370672 A1 * | 8/2015 | ......... H04B 10/2575 |
| WO | 2017072025 A1 | 5/2017 | |

OTHER PUBLICATIONS

Pagan, V.R. et al., "Phase-Modulated Radio-over-Fiber Systems", Optical Fiber Communication Conference/National Fiber Optic Engineers Conference(2013).

Kim, H.J. et al., "All-optical frequency downconversion technique utilizing a four-wave mixing effect in a single semiconductor optical amplifier for wavelength division multiplexing radio-over-fiber application", Optics Express, 20 (7), pp. 8047-8054 (2012).

Park, H.J. et al., "All-optical frequency down-conversion for full-duplex WDM RoF systems utilizing a SOA-MZI", IEEE International Topical Meeting on Microwave Photonics, pp. 321-324 (2005).

Bohemond, C. et al., "Performances of a photonic microwave mixer based on cross-gain modulation in a semiconductor optical amplifier", Journal Lightwave Technology, 29(16), pp. 2402-2409 (2011).

Gopalakrishman, G. et al., "A low-loss Downconverting Analog Fiber-optic Link", IEEE Transactions Microwave Theory Techniques, 43(9), pp. 2318-2323 (1995).

Tamir, Z. et al., "Wideband tunable opto-electronic oscillator based on frequency translation", Optics Letters, 45(15), pp. 2671-2674 (2017).

Tang, Z. et al., "Photonic microwave downconverter based on na optoelectronic oscillator using a single dual-drive Mach-Zehnder modulator", Optics Express, 22 (1), pp. 305-310 (2014).

Zhu, D. et al., "Tunable Frequency-Quadrupling Dual-Loop Optoelectronic Oscillator", 2012 IEEE Photonics Technology Letters, 24 (3) (2012).

Kitayama, K.I. et al., "Optical Downconversion from Millimeter-Wave to IF-Band Over 50-Km-Long Optical Fiber Link Using an Electroabsorption Modulator", IEEE Photonics Technology Letters, 11 (2), pp. 287-289 (1999).

Helkey, R. et al., "A Down-Conversion Optical Link with RF Gain", Journal of Lightwave Technology, 15(6), pp. 956-961 (1997).

Sun, C.K et al., "Efficient Microwave Frequency Conversion Using Photonic Link Signal Mixing", IEEE Photonics Technology Letters, 8(1) (1996).

Williams, K.J. et al., "Optically Amplified Downconverting Link with Shot-Noise Limited Performance", IEEE Photonics Technology Letters, 8(1), pp. 148-150 (1996).

Zhu, D. et al., "High-Performance Photonic Microwave Downconverter Based on a Frequency-Doubling Optoelectronic Oscillator", Journal of Lightwave TEchnology, 30(18), pp. 3036-3042 (2012).

Hielkey, R. et al., "A Down-Conversion Optical Link with RF Gain", Journal of Lightwave Technology, 15(6), pp. 956-961 (1997).

WIPO, International Search Report (in a related application), Jul. 17, 2019.

* cited by examiner

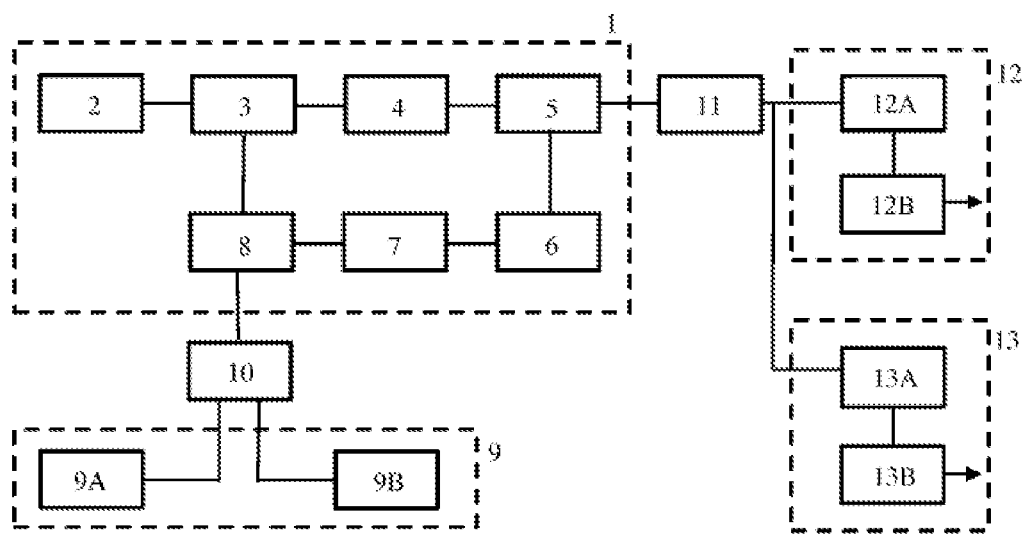

UP/DOWN PHOTONIC FREQUENCY CONVERTER FOR INCOMING RADIO FREQUENCY (RF) SIGNALS BUILT INTO THE OPTOELECTRONIC OSCILLATOR (OEO)

CROSS REFERENCE TO RELATED APPLICATIONS

This application is the US National Phase of, and claims priority on and the benefit of, International Application No. PCT/BR2019/050147 having an International Filing Date of 24 Apr. 2019.

BACKGROUND OF THE INVENTION

Technical Field

The present invention refers to a novel and compact photonic converter for radio frequency (RF) signals comprising an optoelectronic oscillator (OEO) and a radio frequency (RF) signal injection circuit. The optoelectronic oscillator (OEO) is the local oscillator (LO) of the frequency conversion operation and uses only a single Mach-Zehnder (MZ) electro-optical modulator and a single photodetector, which allows for simultaneous frequency conversion into values above and below (down/up converter) of the input radio frequency (RF) signal. The invention field is the field of Electronics, more specifically circuits, oscillator circuits, radio frequency circuits and optoelectronics.

Prior Art

The wide interest in radio frequency (RF) photonic down converters is due to the advantages of its large processing bandwidths, low losses compared to mixers and immunity to electromagnetic interference (Tang Z., Zhang F., Pan S.: "Photonic microwave downconverter based on optoelectronic oscillator using a single dual-drive Mach-Zehnder modulator", Optics Express, 2014, 22 (1), pp. 305-310.; Zhu D., Pan S., Cai S., Ben D.: "High-Performance Photonic Microwave Downconverter Based on a Frequency-Doubling Optoelectronic Oscillator", Journal of Lightwave Technology, 2012, 30 (18), pages 3036-3042.; Gopalakrishnan G., Moeller R., Howerton M., Burns W., Williams K., Esman R.: "A low-loss downconverting analog fiber-optic link", IEEE Transactions Microwave Theory Techniques, 1995, 43(9), pp. 2318-2323). Such characteristics are very attractive in microwave photonic systems, transmission of microwave signals in optical fibers (radio-over-fiber), signal processing in antenna networks (phased-array), wireless communication and electronic warfare systems (Zhang T, Pan W., Zou X., Luo B., Yan L., Liu X., Lu B.: "High-spectral-efficiency photonic frequency down-conversion using optical frequency comb and SSB modulation", IEEE Photonics Journal, 2013, 5(2), 7200307.; Zhu D., Pan S., Cai S., Ben D.: "High-Performance Photonic Microwave Downconverter Based on a Frequency-Doubling Optoelectronic Oscillator", Journal of Lightwave Technology, 2012, 30 (18), pp. 3036-3042). The down-converter system is used to convert a high-frequency RF signal into baseband or an intermediate frequency (IF) for further processing in a receiving system.

For example, US 2016/0254646A1 shows an optical frequency splitter based on a frequency combiner with an electro-optical modulator, whose circuit is much more complex because it uses two optical filters, two photodetectors and an optical amplifier.

The patent document US 2001/0014106A1 shows an optical electromagnetic wave generator, whose circuit employs two tunable lasers, a delay circuit.

Now, the patent document TW201201503 describes a structure that uses an optical filter and an optical amplifier.

The patent document CA03002597 describes a structure for photonic generation of arbitrary microwave signals having a linear frequency modulation, which circuit has an optical filter, an isolator and an optical amplifier.

The optoelectronic oscillator, OEO, can be used as a remote source of a reference signal for frequency conversion at remote sites interconnected by optical fibers (Britto, L. A. D. Optoelectronic oscillator for Microwave Generation and Remote Receiver Applications, 2013, Master's degree dissertation). Such application does not correspond to the described system, but in a conventional way to the use of radio frequency mixers.

Patent document US2018248518A1 describes a system with signal generation by means of an optoelectronic oscillator whose frequency signal conversion is done by means of an external block called downconverter, a block composed of several components, however the filtering of the converted frequency is made by an external filtering system using a tunable filter. This system generates and filters spectral components with a high number of individual systems and an excessive number of components.

Now the patent document WO2017/072025AI describes a system for generating arbitrary microwave signals composed of optical isolator, optical amplifier, optical filter, acoustic-optical frequency shifter and optical amplifier.

The article "High-Performance Photonic Microwave Downconverter Based on a Frequency-Doubling Optoelectronic Oscillator" by Zhu D., Pan S., Cai S., Ben D, published in 2012 in the Journal of Lightwave Technology, 30 (18), pp. 3036-3042 describes a structure for frequency signal conversion, this system being comprised of a high number of components, such as: external microwave source, polarization controller, polarization modulator, optical amplifier and two photodetectors.

The article "High-Spectral-Efficiency Photonic Frequency Down-Conversion Using Optical Frequency Comb and SSB Modulation" by Zhang T, Pan W., Zou X., Luo B., Yan L., Liu X., Lu B, published in 2013 by IEEE Photonics Journal, 5(2), 7200307 describes a frequency conversion system with high spectral efficiency using an optical frequency combiner and SSB modulation. The configuration proposed in this article is comprised of a polarization controller, a polarization modulator, a polarizer, a mixer, a phase shifter and a tunable filter.

The article "Phase-Modulated Radio-over-Fiber Systems" by Pagen V. R., Murphy T. E., published in the Optical Fiber Communication Conference/National Fiber Optic Engineers Conference, in 2013, describes a frequency conversion system using two distinct systems, the transmitter and the receiver. Each of these systems is composed of two modulators and an optical amplifier.

The article "All-optical frequency downconversion technique utilizing a four-wave mixing effect in a single semiconductor optical amplifier for wavelength division multiplexing radio-over-fiber application" by Kim H. J., Song J. I, published in 2012 by Optics Express, 20(7), pp. 8047-8054 makes the frequency conversion using a system with three laser sources, optical amplifiers, electro-absorption modulator, electro-optical MZ modulator, optical attenuators, optical filters, mixer and a local oscillator.

The article "All-optical frequency down-conversion for full-duplex WDM RoF systems utilizing a SOA-MZI" by Song, H. J., Park M., Kim H. J., Lee J. S, Song J. I, published in IEEE international Topical Meeting on Microwave Photonics, 2005, pp. 321-324 describes a frequency conversion system using a system with an optical amplifier.

The article "Performances of a photonic microwave mixer based on cross-gain modulation in a semiconductor optical amplifier" by Bohemond C., Rampone T., Sharaiha A., published by Journal Lightwave Technology, in 2011, 29(16), pp. 2402-2409, describes a system based on a frequency mixer comprising an optical signal source, a local oscillator, polarization controllers, optical isolators, optical attenuators and optical amplifier.

The article "A low-loss Downconverting Analog Fiber-optic Link" by Gopalakrishman G., Moeller R., Howerton M., Burns W., Williams K., Esman R., published in IEEE Transactions Microwave Theory Techniques, 1995, 43(9), pp. 2318-2323, converts the signal using two modulators and two photodetectors.

The article "Wideband tunable opto-electronic oscillator based on frequency translation" by Tamir Z., Meltzer A, Horowitz M., published in Optics Letters, in 2017, 45(15), pp. 2671-2674, uses two frequency mixers, an external local oscillator as a radio frequency (RF) signal generation source, in addition to the optoelectronic oscillator used in the circuit loop.

The article "Photonic microwave downconverter based on an optoelectronic oscillator using a single dual-drive Mach-Zehnder modulator" by Tang Z., Zhang F., Pan S., published in Optics Express, 2014, 22 (1), pp. 305-310, makes the frequency conversion through a system composed of: polarization controller, an MZ modulator with two radio frequency (RF) inputs, two photodetectors, a band-pass filter and a low-pass filter.

The article "Tunable Frequency-Quadrupling Dual-Loop Optoelectronic Oscillator" by Zhu D., Pan S., and Ben D., published in the 2012 IEEE Photonics Technology Letters, 24 (3), makes frequency tuning through a system composed of polarization controller, polarization modulator and tunable filter.

The article "Optical Downconversion from Millimeter-Wave to IF-Band Over 50-Km-Long Optical Fiber Link Using an Electroabsorption Modulator" by Kitayama K. I. and Griffi R A, published in IEEE Photonics Technology Letters, in 1999, 11 (2), pp. 287-289, converts the frequency signal using a system with two lasers, two photodetectors, two mixers, a local oscillator and an electro-absorption modulator.

The article "A Down-Conversion Optical Link with RF Gain" by Helkey R., Jon C. Twichell J. C. and Cox C, published in the Journal of Lightwave Technology, 1997, 15(6), pp. 956-961 describes a downconverter system using two laser sources and two modulators in series.

The article "Efficient Microwave Frequency Conversion Using Photonic Link Signal Mixing" by Sun C. K., Orazi R. J., and Papper S. A., published in IEEE Photonics Technology Letters, 1996, 8(1), uses a system with two cascade optical modulators.

The article "Optically Amplified Downconverting Link with Shot-Noise Limited Performance" by Williams K. J. and Esman R. D., published in IEEE Photonics Technology Letters, 1996, 8(1), pp. 148-150 uses two MZ modulators and four photodetectors.

A common deficiency in the solutions disclosed in the prior art documents is the use of multiple filters, photodetectors and modulators in the respective circuits. Currently, many photonic frequency converters from microwave signals into signals with lower frequency values have been proposed (Tang Z., Zhang F., Pan S.: "Photonic microwave downconverter based on na optoelectronic oscillator using a single dual-drive Mach-Zehnder modulator", Optics Express, 2014, 22 (1_, pp. 305-3010.; Zhu D., Pan S., Cai S., Ben D.: "High-Performance Photonic Microwave Downconverter Based on a Frequency-Doubling Optoelectronic Oscillator", Journal of Lightwave Technology, 2012, 30 (18), pp. 3036-3042.; Tamir Z., Meltzer A., Horowitz M; "Wideband tunable opto-electronic oscillator based on frequency translation", Optics letters, 2017, 42(15), pp. 2671-2674.; Zhang T, Pan W., Zou X., Luo B., Yan L., Liu X., Lu B.: "High-spectral-efficiency photonic frequency down-conversion using optical frequency comb and SSB modulation," IEEE Photonics Journal, 2013, 5(2), 7200307.; Gopalakrishnan G., Moeller R., Howerton M., Burns W., Williams K., Esman R.: "A low-loss downconverting analog fiber-optic link," IEEE Transactions Microwave Theory Techniques, 1995, 43(9), p. 2318-2323; Pagen V. R., Murphy T. E.: "Phase-modulated radio-over fiber systems," in Optical Fiber Communication Conference/National Fiber Optic Engineers Conference 2013, OSA Technical Digest (online) (Optical Society of America, 2013), paper OW1D.5.; Bohemond C., Rampone T., Sharaiha A., "Performances of a photonic microwave mixer based on cross-gain modulation in a semiconductor optical amplifier," Journal Lightwave Technology, 2011, 29(16), pp. 2402-2409.; Song H. J., Park M., Kim H. J., Lee J. S, Song J. I., "All-optical frequency down-conversion for full-duplex WDM RoF systems utilizing an SOA-MZI," in IEEE International Topical Meeting on Microwave Photonics (MWP, 2005), pp. 321-324.; Kim H. J., Song J. I., "All-optical frequency downconversion technique utilizing a four-wave mixing effect in a single semiconductor optical amplifier for wavelength division multiplexing radio-over-fiber applications," Optics Express, 2012, 20(7), pp. 8047-8054), most of these systems are composed of cascade electro-optic modulators, polarization modulator followed by Mach-Zehnder modulator and cascade phase modulators. One of the characteristics inherent to configurations based on cascade modulators is the high isolation between the radio frequency (RF) signal and the local oscillator (LO) and the large operating bandwidth provided by electro-optical modulators. However, the use of multiple modulators leads to a large insertion loss and is costly, which ends up being a disadvantage.

There is a need for a simpler solution to convert the radio frequency (RF) signal frequency into another frequency of interest using only a single circuit in which the radio frequency (RF) frequency signal is applied to the single electro-optical modulator and then takes place the frequency conversion operation to a value above and or below.

BRIEF SUMMARY OF THE INVENTION

In the present invention, the inconveniences of the structures described above are avoided, showing for that a simple and compact photonic converter allowing to raise or lower the frequency of the signal applied to its input (down/up converter) based on an optoelectronic oscillator using only a single electro-optic MZ modulator and a single photodetector. In the configuration proposed herein, the radio frequency (RF) signal, whose frequency will be converted into a new value, is applied to one of the power combiner inputs 10 that is connected to the power combiner 8, which is part of the OEO feedback loop. The other input of the power combiner 8 receives the radio frequency (RF) signal generated in the OEO itself. The output of the power combiner 8 is then applied to the radio frequency (RF) signal input of the MZ electro-optical modulator 3 which is part of the OEO. Frequency conversion occurs by intermodulation within the MZ modulator between the signal generated in the OEO and the radio frequency (RF) signal applied to the input of the signal combiner that is part of the feedback loop of the OEO. As the frequency conversion process is based on the intermodulation between the radio frequency (RF) signals applied at the input of the MZ modulator, there will then be frequency components shifted to higher values (up converter) and to lower values (down converter) simultaneously. This fact has been neglected in the configurations disclosed in several works and patents.

The following advantages and essential characteristics of the invention are highlighted:

- A single Mach-Zehnder (MZ) electro-optical modulator 3 is used to form an OEO 1, which generates a reference signal that is part of the intermodulation process and is wherein the conversion of the radio frequency (RF) signal to the desired frequency. In this way, this configuration is compact, with a small size, reduced number of components and has a low cost;
- A single photodetector 4 in the feedback loop is needed to convert the signal in the optical domain into the electrical domain due to the existence of only one optical-electrical (O/E) conversion point;
- The radio frequency (RF) signal can be injected from three different signal sources: a) an radio frequency (RF) signal with frequency $f_1$ coming from a generator or an antenna amplifier in a receiving system; b) an radio frequency (RF) signal with frequency $f_2$ can be that coming from a generator or from a modulation system (baseband) in a transmitter system; and c) the radio frequency (RF) signal with frequency $f_1$ and the signal with frequency $f_2$ coming simultaneously from the signal sources indicated in a) and b) items above. In this way, the photonic frequency converter circuit of the present patent application can use two radio frequency (RF) signal inputs simultaneously (it also works with only one of the two inputs receiving a signal). It should be noted that in all three cases, it is not necessary to use an additional local oscillator (LO), as the OEO provides the reference signal with frequency $f_0$ for frequency conversion. It should be noted that the characteristics mentioned in a) and b) items can occur simultaneously c) and allow combining the function of converting the frequency of a signal applied in the converter to a value above (up converter) and or below (down converter) in a single system having characteristics for an integrated receiver and transmitter system together in a single circuit.

Contrary to the characteristics of the present invention, it should be noted that: a) the prior-art photonic frequency converter circuits have a greater number of components and often a greater number of optical MZ-type modulators; b) in the prior-art photonic frequency converter circuits, optical-electrical conversion (O/E) is performed at different points in the circuits and, as a consequence, as many photodetectors as the number of these points will be needed; c) the prior-art photonic frequency converter circuits are limited to receiving a single injected RF-signal generally to perform the frequency conversion for values below (down converter) and, therefore, have a single radio frequency (RF) input; d) the photonic frequency converter circuits existing in the prior art convert the frequency only to a lower value (only down converter) using much more complex circuits and with a larger number of components.

BRIEF DESCRIPTION OF THE DRAWINGS

The invention will be explained as an embodiment, particularly aimed at a photonic circuit in which the process of simultaneous frequency conversion of radio frequency (RF) signals into values higher and lower the frequencies of the signals applied in the converter, the solution being best illustrated in attached FIGURE, wherein is represented:

FIG. 1 is a block diagram of a simple photonic down/up converter integrated to the local oscillator (LO), based on an optoelectronic oscillator (OEO).

DETAILED DESCRIPTION OF THE INVENTION AND EXEMPLARY EMBODIMENT

The photonic frequency converter (PFC) for values above and below the input radio frequency (RF) signal integrated to the optoelectronic oscillator (OEO) and process thereof, as disclosed herein, comprises a compact photonic frequency converter (PFC) for radio frequency (RF) signals consisting of an optoelectronic oscillator (OEO) and a radio frequency (RF) signal injection circuit (IC). The optoelectronic oscillator (OEO) is the local oscillator (LO) of the frequency conversion operation and uses only a single Mach-Zehnder (MZ) electro-optical modulator 3 and a single photodetector 4, which allows for simultaneous performance of frequency conversion for values above and below (down/up converter) of the input radio frequency (RF) signal.

As shown in FIG. 1, the central dashed block 1 illustrates the optoelectronic oscillator (OEO) 1 of the frequency converter circuit. The optoelectronic oscillator (OEO) 1 is composed of a continuous light laser source 2, a MZ electro-optical modulator 3, a single photodetector 4, a power splitter 5, a band-pass radio frequency (RF) filter 6, amplifier 7 and a power combiner 8 which is responsible for feeding back the radio frequency (RF) input of the MZ electro-optical modulator 3. It is essential to note that the power splitter 5 cannot be connected to any point of the optoelectronic oscillator (OEO) 1.

The optoelectronic oscillator (OEO) 1 comprises an optical link and a feedback loop in the radio frequency (RF) domain. The optical link consists of the continuous light laser source 2, the MZ electro-optical modulator 3 and the single photodetector 4. The feedback loop in the radio frequency (RF) domain, in turn, consists of the power splitter 5, the band-pass radio frequency (RF) filter 6 with centered frequency response band on $f_0$, the amplifier 7 and the power combiner 8. The power splitter 5 must be mandatorily connected after the single photodetector 4 and connected before the band-pass radio frequency (RF) filter 6, so that the intermodulation signal is available for its processing. This is due to the fact that only in this arrangement/configuration the band-pass radio frequency (RF) filter 6 is able to only allow the passage of signals comprised in its frequency response band, that is, it will inhibit the other various frequency components generated by intermodulation inside the MZ electro-optical modulator 3, thus preventing the operation of the optoelectronic oscillator (OEO) 1, as a local oscillator, from being disturbed.

The radio frequency (RF) signal source that will have its frequency shifted up or down is indicated by an input signal block 9, and the injection circuit (IC) 9 consists of a block representing the radio frequency (RF) signal source with frequency $f_1$ 9A and a block representing the radio frequency (RF) signal source with frequency $f_2$ 9B. Note that in the injection circuit (IC) 9 the possibility of more than one signal applied simultaneously for frequency conversion is considered. Each radio frequency (RF) signal source, 9A and 9B, will inject a signal with a certain frequency. The outputs of these two signal sources will be combined in a power combiner 10 and then injected into the optoelectronic oscillator (OEO) 1. For the purpose of understanding the operation of the photonic frequency converter (PFC) proposed herein, it should be considered that the optoelectronic oscillator (OEO) 1 generates a signal of frequency $f_0$. The two applied radio frequency (RF) signals have frequencies $f_1$ and $f_2$, respectively.

In the optoelectronic oscillator (OEO) 1 block where the reference signal $f_0$ is generated, whose value is defined by the frequency response band of the bandpass radio frequency (RF) filter 6, the applied radio frequency (RF) signals of frequencies $f_1$ and $f_2$ coming from the radio frequency (RF) signal blocks of frequency 9A and 9B, will undergo intermodulation with the signal of frequency $f_0$ generated in the optoelectronic oscillator (OEO). The intermodulation signal, with frequencies above and below the frequencies of the injected external signals ($f_0-f_1$, $f_0-f_2$, $f_0+f_1$, $f_1-f_2$, etc.) is selected by filters 12A and 13A after the power splitter 5 and amplifier 11 which are connected after the single photodetector 4 of the optoelectronic oscillator (OEO). After the power splitter 5 there are filters 12A and 13A for selecting frequencies above and below the $f_1$ and $f_2$ frequencies of the external signals applied. The signals after the filters that follow the power splitter 5 represent the output signals of the photonic frequency converter (PFC). After amplifier 11, the signals with frequencies above and below the frequencies of the applied external signals can be used in transmission (T) 12 and reception (R) 13 steps.

To illustrate with numerical values, we consider $f_0=2$ GHz, $f_1=1.3$ GHz and $f_2=1.5$ GHz. For these values as an example, we can consider the reception and transmission output spectrum with frequencies from 200 MHz ($f_2-f_1$) up to 3.5 GHz ($f_0+f_2$), with difference ($f_0-f_1$)=700 MHz and $f_0-f_2$=500 MHz; and the sum $f_0+f_1$=3.3 GHz and $f_0+f_2$=3.5 GHz. Signals with the frequency value down converted, 500 MHz ($f_0-f_2$) and/or 700 MHz ($f_0-f_1$), can be directed to signal processing steps, thus completing the reception of the signal injected into the converter. Signals with the frequency value up converted, 3.3 GHz ($f_0+f_1$) and/or 3.5 GHz ($f_0+f_2$), can be directed to signal processing steps, thus completing the transmission of the signal injected into the converter. It is worth mentioning that applying only one signal at the input of the photonic frequency converter (PFC), the power spectrum at the output, whether receiving (R) or transmitting (T), will have a smaller number of spectral components without changing its operating principle as only operations with $f_0$ and f of the single applied signal will be counted in the definition of frequencies present at the outputs.

The invention claimed is:

1. A photonic frequency converter for converting values above and below an input radio frequency (RF) signal, comprising:
    an integrated optoelectronic oscillator (OEO) comprising an optical link and a feedback loop in radio frequency (RF) domain;
    an injection circuit (IC) for injecting the input radio frequency (RF) signal, wherein the optoelectronic oscillator (OEO) being a local oscillator (LO) of frequency conversion operation using only a single Mach-Zehnder (MZ) electro-optical modulator and a single photodetector, which allows to perform simultaneously the frequency conversion into the values above and below (down/up converter) the input radio frequency (RF) signal;
    a radio frequency (RF) band pass filter; and
    a power splitter connected between the single photodetector and the radio frequency (RF) band pass filter;
    wherein more than one signal is simultaneously applied for frequency conversion;
    wherein a first radio frequency (RF) signal source injects a signal with a frequency $f_1$ and a second radio frequency (RF) signal source injects a signal with a frequency $f_2$;
    wherein the signal with the frequency $f_1$ and the signal with the frequency $f_2$ are combined in a first power combiner to then be injected into the optoelectronic oscillator (OEO) through a second power combiner; and
    wherein the optoelectronic oscillator (OEO) generates a frequency signal $f_0$, defined by a frequency response band of the radio frequency (RF) band pass filter.

2. The photonic frequency converter according to claim 1, wherein the optical link comprises a continuous light laser source, the MZ electro-optical modulator, and the photodetector; and wherein the feedback loop consists of the power splitter, the radio frequency (RF) band pass filter, a first amplifier and a power combiner responsible for feeding back the input radio frequency (RF) signal to the MZ electro-optical modulator.

3. The photonic frequency converter according to claim 2, wherein in the optoelectronic oscillator (OEO) where the frequency signal $f_0$ is generated, the signal with the frequency $f_1$ and the signal with the frequency $f_2$ undergoes intermodulation in the MZ electro-optical modulator with the frequency signal $f_0$ generated in the optoelectronic oscillator (OEO), an intermodulation signal, with frequencies above and below the frequencies $f_1$ and $f_2$ ($f_0-f_1$, $f_0-f_2$, $f_0+f_1$, $f_1-f_2$, etc.), is selected by at least one selection filter after the power splitter and a second amplifier connected after the single photodetector of the optoelectronic oscillator (OEO), and after the second amplifier there are the selection filters of frequency above and below the frequencies $f_1$ and $f_2$, and signals after the selection filters following the second amplifier represent the output signals with frequencies above and below the frequencies $f_1$ and $f_2$ of the that can be used in transmission (T) and reception (R) steps.

4. The photonic frequency converter according to claim 1, wherein in the optoelectronic oscillator (OEO) where the frequency signal $f_0$ is generated, the signal with the frequency $f_1$ and the signal with the frequency $f_2$ undergoes intermodulation in the MZ electro-optical modulator with the frequency signal $f_0$ generated in the optoelectronic oscillator (OEO), an intermodulation signal, with frequencies above and below the frequencies $f_1$ and $f_2$ ($f_0-f_1$, $f_0-f_2$, $f_0+f_1$, $f_1-f_2$, etc.), is selected by at least one selection filter after the power splitter and a second amplifier connected after the single photodetector of the optoelectronic oscillator (OEO), and after the second amplifier there are the selection filters of frequency above and below the frequencies $f_1$ and $f_2$, and signals after the selection filters following the second amplifier represent output signals with frequencies above and below the frequencies $f_1$ and $f_2$, that can be used in transmission (T) and reception (R) steps.

* * * * *